United States Patent
Chujo et al.

(10) Patent No.: US 7,918,020 B2
(45) Date of Patent: Apr. 5, 2011

(54) METHOD FOR MANUFACTURING ELECTROCONDUCTIVE MATERIAL-FILLED THROUGHHOLE SUBSTRATE

(75) Inventors: Shigeki Chujo, Yashio (JP); Koichi Nakayama, Matsudo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 130 days.

(21) Appl. No.: 11/791,593

(22) PCT Filed: Nov. 14, 2005

(86) PCT No.: PCT/JP2005/020823
§ 371 (c)(1),
(2), (4) Date: May 24, 2007

(87) PCT Pub. No.: WO2006/057175
PCT Pub. Date: Jun. 1, 2006

(65) Prior Publication Data
US 2008/0092378 A1    Apr. 24, 2008

(30) Foreign Application Priority Data

Nov. 24, 2004  (JP) ................................ 2004-338491

(51) Int. Cl.
*H01K 3/10* (2006.01)
(52) U.S. Cl. ............... 29/852; 29/830; 29/874; 205/125
(58) Field of Classification Search ............ 29/852, 29/846, 831, 829, 874, 74; 205/125; 427/97.2, 427/97.8
See application file for complete search history.

(56) References Cited

U.S. PATENT DOCUMENTS

| 4,368,106 | A | 1/1983 | Anthony |
| 4,396,467 | A | 8/1983 | Anthony |
| 4,741,799 | A | 5/1988 | Chen et al. |
| 5,231,751 | A * | 8/1993 | Sachdev et al. ............... 29/852 |
| 6,190,493 | B1 | 2/2001 | Watanabe et al. |
| 6,221,769 | B1 | 4/2001 | Dhong et al. |
| 6,645,607 | B2 * | 11/2003 | Curcio et al. ............... 428/209 |
| 7,262,076 | B2 * | 8/2007 | Aizawa et al. ............... 438/106 |
| 2003/0086248 | A1 * | 5/2003 | Mashino ........................ 361/767 |
| 2004/0115340 | A1 * | 6/2004 | Griego ............................ 427/98 |

(Continued)

FOREIGN PATENT DOCUMENTS

JP          09-130050       5/1997

(Continued)

OTHER PUBLICATIONS

Korean Office Action dated Apr. 8, 2009 and partial English translation thereof.

(Continued)

*Primary Examiner* — A. Dexter Tugbang
*Assistant Examiner* — Azm Parvez
(74) *Attorney, Agent, or Firm* — Harness, Dickey & Pierce, PLC

(57) ABSTRACT

Disclosed is a method for manufacturing an electroconductive material-filled throughhole substrate that is free from any void part in the electroconductive material filled into the throughholes. The method comprises forming an electroconductive base layer on one side of a core substrate having throughholes, and precipitating and growing an electroconductive material from one direction within the throughholes by electroplating using the electroconductive base layer as a seed layer to fill the electroconductive material into the throughholes without forming any void part and thus to manufacture an electroconductive material-filled throughhole substrate.

7 Claims, 1 Drawing Sheet

U.S. PATENT DOCUMENTS

2004/0251554 A1    12/2004    Masuda

FOREIGN PATENT DOCUMENTS

| | | |
|---|---|---|
| JP | 2001-068856 | 3/2001 |
| JP | 2002-134908 | 5/2002 |
| JP | 2002-334956 | 11/2002 |
| JP | 2003-023251 | 1/2003 |
| JP | 2003-060343 | 2/2003 |
| JP | 2003-273170 | 9/2003 |
| JP | 2003-283085 | 10/2003 |
| JP | 2004-128053 | 4/2004 |
| JP | 2004-193295 | 7/2004 |

OTHER PUBLICATIONS

Japanese Office Action dated Dec. 4, 2009 and English translation thereof.

Extended European Search Report dated Nov. 10, 2010.

* cited by examiner

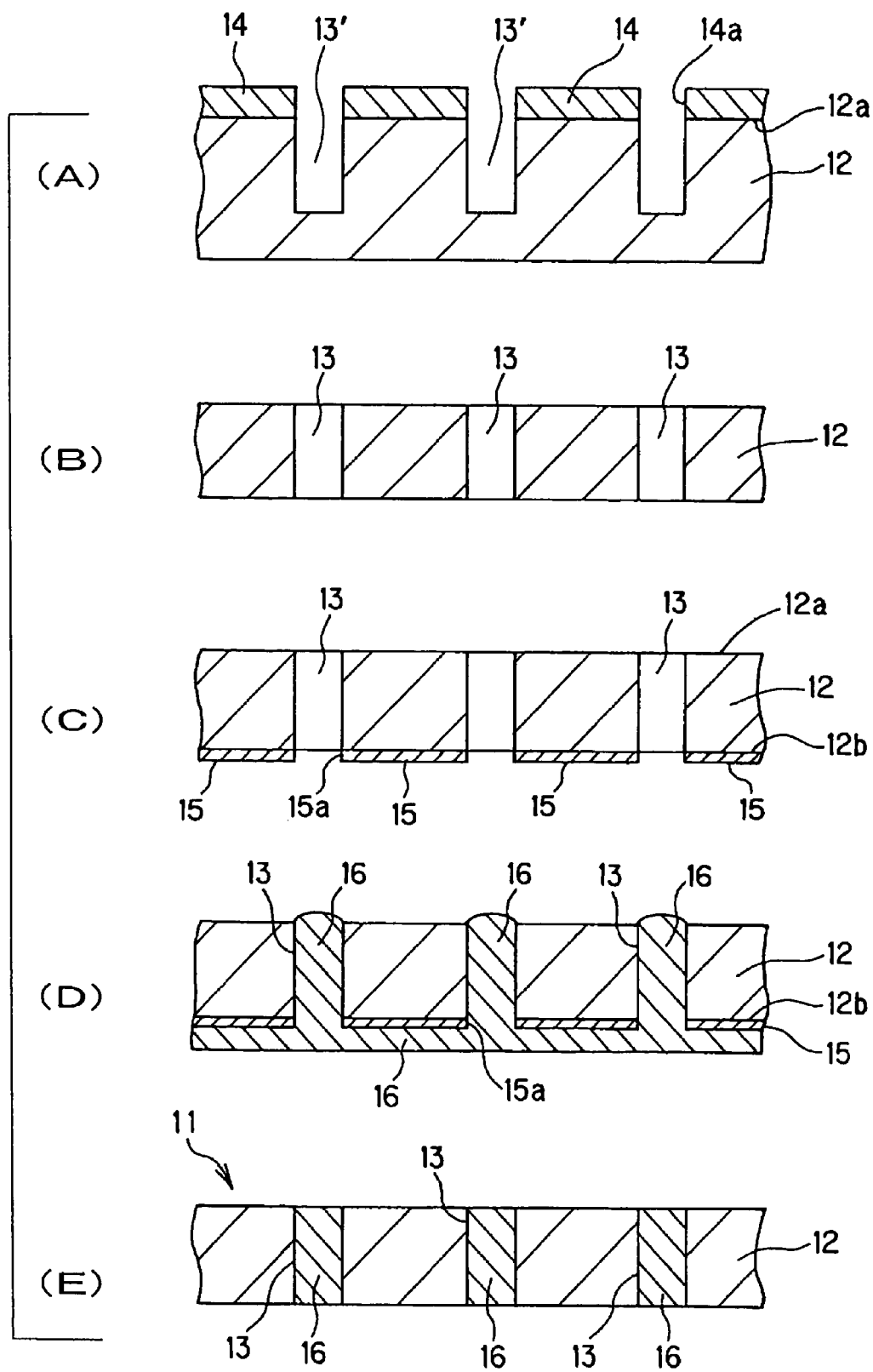
F I G. 1

METHOD FOR MANUFACTURING ELECTROCONDUCTIVE MATERIAL-FILLED THROUGHHOLE SUBSTRATE

BACKGROUND OF THE INVENTION

1. Field of Invention

The present invention provides a method for manufacturing an electroconductive material-filled throughhole substrate and more particularly to a method for manufacturing an electroconductive material-filled throughhole substrate which is advantageous in that high-density wiring boards such as multilayer wiring boards for mounting semiconductor chips can be formed.

2. Background Art

In recent years, an advance of an enhancement in performance, a size reduction and a weight reduction of electronic equipment has led to a demand for a size reduction, multipin design, and fine pitches of external terminals in semiconductor packages. Accordingly, there is an ever-increasing demand for higher-density wiring boards. To meet this demand, mounting of LSIs directly on printing wiring boards or mounting of CSPs (chip size packages) and BGAs (ball grid arrays) on printed wiring boards has become adopted. Regarding printed wiring boards as well, to cope with a demand for higher density, multilayer wiring boards manufactured by a buildup method, in which wiring and via are built up one layer by one layer onto a core substrate through an electrical insulating layer to form a multilayer structure, have become used.

In conventional buildup multilayer wiring boards, an electroconductive material-filled throughhole substrate formed by drilling throughholes in an insulating substrate and plating the inner side of the throughholes with a metal, and filling a resin or an electroconductive paste into the throughholes has been used (Japanese Patent Laid-Open No. 130050/1997). In this electroconductive material-filled throughhole substrate, the front and back sides are electrically conducted to each other through the throughholes, and wiring is built up through an electrical insulating layer onto this electroconductive material-filled throughhole substrate to form a multilayer structure and thus to form a multilayer wiring board. Further, in recent years, a multilayer wiring board having a laminated structure has been developed. This multilayer wiring board has been formed by subjecting resin-filled throughholes to lid plating to form a plating layer so as to clog the opening part in the throughholes, disposing vias immediately above the lid plated parts, and further disposing vias on the vias (Japanese Patent Laid-Open No. 23251/2003).

DISCLOSURE OF THE INVENTION

Problems to be Solved by the Invention

Since, however, the formation of the throughholes by the conventional technique is carried out by drilling, throughholes having a smaller opening diameter than the drill diameter cannot be formed. Drilling using a fine drill to overcome this problem resulted in an increased frequency of breakage of the drill. This poses a problem that the formation of fine throughholes is so difficult that the degree of freedom of wiring design is limited.

Further, the structure in which the resin-filled throughholes have been subjected to lid plating is also disadvantageous in that the resin filled into the throughholes is stretched or shrunk due to thermal shrinkage or thermal expansion of an insulating substrate used and, consequently, stress is likely to concentrate on the vias formed on the lid-plated part, resulting in lowered connection reliability. This problem can be solved by using an electroconductive material-filled throughhole substrate in which only the electroconductive material has been filled into the throughholes. In this case, however, the presence of a void part in the electroconductive material filled into the throughholes poses a problem that electrical characteristics as designed cannot be obtained.

The present invention has been made under the above circumstances, and an object of the present invention is to provide a method for manufacturing an electroconductive material-filled throughhole substrate free from any void part in an electroconductive material filled into throughholes.

Means for Solving the Problems

The above object can be attained by a method for manufacturing an electroconductive material-filled throughhole substrate of which the front side and back side have been electrically conducted to each other through an electroconductive material filled into the throughholes, the method comprising the steps of: forming an electroconductive base layer on one side of a core substrate having throughholes; and filling the throughholes with an electroconductive material by electroplating using the electroconductive base layer as a seed layer.

In a preferred embodiment of the present invention, the core substrate having the throughholes is formed by subjecting the core substrate to dry etching utilizing plasma to form throughholes having an opening diameter in the range of 10 to 100 μm on the core substrate.

In a preferred embodiment of the present invention, the core substrate having the throughholes is formed by subjecting the core substrate to dry etching utilizing plasma from one side of the core substrate to form pores having an opening diameter in the range of 10 to 100 μm to a predetermined depth and then polishing the other side of the core substrate to expose the pores on the other side of the core substrate and thus to form throughholes.

In a preferred embodiment of the present invention, the electroconductive base layer is formed by either vapor deposition or sputtering.

In a preferred embodiment of the present invention, the throughholes are formed so as to have an opening diameter in the range of 10 to 70 μm.

In a preferred embodiment of the present invention, the core substrate is a silicon substrate.

In a preferred embodiment of the present invention; the electroconductive material is copper.

EFFECT OF THE INVENTION

According to the present invention, an electroconductive material is filled into throughholes by precipitating and growing the electroconductive material from one direction into the throughholes using an electroconductive base layer, formed on one side of a core substrate, as a seed layer. Accordingly, a dense electroconductive material can be formed within the throughholes without forming any void part, and, thus, an electroconductive material-filled throughhole substrate, which can develop electrical characteristics as designed, can be provided. Further, when dry etching utilizing plasma is adopted for throughhole formation, throughholes having a small opening diameter can be formed. Also in this case, the electroconductive material can be filled into the throughholes without forming any void part, and, thus, an electroconductive material-filled throughhole substrate having throughholes provided at narrow pitches can be realized. Further, since there is no need to provide a resin within the throughholes, an electroconductive material-filled throughhole substrate having high connection reliability can be provided.

BRIEF DESCRIPTION OF THE DRAWING

FIG. 1 is a process diagram showing one embodiment of the method for manufacturing an electroconductive material-filled throughhole substrate according to the present invention.

BEST MODE FOR CARRYING OUT THE INVENTION

Embodiments of the present invention will be described with reference to the accompanying drawing.

FIG. 1 is a process diagram showing one embodiment of the method for manufacturing an electroconductive material-filled throughhole according to the present invention.

In the method for manufacturing an electroconductive material-filled throughhole substrate according to the present invention, a mask pattern 14 having predetermined openings 14a is formed on one side 12a of a core substrate 12. Pores 13' having a predetermined depth are bored in the core substrate 12 by ICP-RIE (inductive coupled plasma-reactive ion etching), which is dry etching utilizing plasma, using this mask pattern 14 as a mask (FIG. 1 (A)).

The core substrate 12 may be formed of, for example, silicon or glass. If necessary, an electrical insulation layer formed of, for example, silicone dioxide or silicon nitride may be formed on the front side 12a and the back side 12b of the core substrate 12.

The mask pattern 14 may be formed using a dry etching-resistant material, for example, using a positive-working resist of a novolak resin. Alternatively, the mask pattern 14 may be formed by using a material having a smaller etching selection ratio (a smaller etching rate) than the core substrate 12, for example, by using silicon oxide, silicon nitride on a core substrate 12 formed of silicon.

The opening diameter of the pores 13' to be formed may be properly determined in the range of 10 to 100 μm, preferably 10 to 70 μm. The depth of the pores 13' may be properly determined by taking into consideration the thickness of the electroconductive material-filled throughhole substrate to be manufactured (for example, 50 to 725 μm), for example, may be properly determined in the range of 70 to 745 μm. Thus, the formation of throughholes having a small opening diameter can be realized by forming pores 13' for throughholes by dry etching utilizing plasma.

Next, the mask pattern 14 is removed from the core substrate 12, and the other side 12b of the core substrate 12 is polished to expose the pores 13' and thus to form throughholes 13 (FIG. 1 (B)). Thus, a core substrate 12 having throughholes 13 is provided.

An insulating layer and an electroconductive material diffusion barrier layer may if necessary be formed on the inner wall face and surface of the formed throughholes 13.

When the core substrate 12 is formed of a silicon substrate, the silicon substrate may be thermally oxidized to form a silicon oxide film as the insulating layer. Alternatively, when the core substrate 12 is formed of silicon and other material, a silicon oxide film or a silicon nitride film may be formed as the insulating layer by plasma CVD (chemical vapor deposition). The thickness of the insulating layer may be determined, for example, in the range of 500 to 4000 nm.

The electroconductive material diffusion barrier layer may be a thin film formed of, for example, titanium nitride, titanium or chromium. This electroconductive material diffusion barrier layer may be formed, for example, by MO-CVD (metal organic-chemical vapor deposition) or sputtering. In particular, when the opening diameter of the throughholes 13 is not more than 30 μm, preferably, the electroconductive material diffusion barrier layer is formed by MO-CVD.

The insulating layer and the electroconductive material diffusion barrier layer may be formed, for example, from the inner wall surface side of the throughholes 13, in the order of electroconductive material diffusion barrier layer/insulating layer, in the order of insulating layer 1/electroconductive material diffusion barrier layer/insulating layer 2, in the order of insulating layer 2/electroconductive material diffusion barrier layer/insulating layer 2, or in the order of insulating layer 1/insulating layer 2/electroconductive material diffusion barrier layer/insulating layer 2. The insulating layer 1 is an insulating layer formed by the thermal oxidation or plasma CVD, and the insulating layer 2 is an insulating layer formed by the plasma CVD.

Next, an electroconductive base layer 15 is formed on one side 12b of the core substrate 12 (FIG. 1 (C)). This electroconductive base layer 15 has openings 15a corresponding to the throughholes 13 and may be formed, for example, by vapor deposition or sputtering. The electroconductive base layer 15 may have a single-layer structure of, for example, copper, nickel, titanium, chromium, or tungsten, or a multilayer structure of a combination of two or more of them, for example, titanium/copper and titanium/nickel. The thickness of the electroconductive base layer 15 may be determined, for example, in the range of about 10 to 1000 nm. In the embodiment shown in the drawing, the electroconductive base layer 15 has been formed on the core substrate 12 on its face 12b polished in the pre-step. Alternatively, the electroconductive base layer 15 may be formed on the face 12a as one side of the core substrate 12.

Next, an electroconductive material 16 is filled into the pores 13 by electroplating using the electroconductive base layer 15 as a seed layer (FIG. 1 (D)). In this electroplating step, the electroconductive material 16 is precipitated on the electroconductive base layer 15, and, further, the electroconductive material 16 is intensively precipitated in the openings 15a having a high electric field density to clog the openings 15a. The electroconductive material 16 is precipitated and grown from the clogged site toward the inside of the throughholes 13 to fill the electroconductive material 16 into the throughholes 13. Thus, in the present invention, since the electroconductive material 16 is precipitated and grown from one direction into the throughholes 13 using the electroconductive base layer 15 as a seed layer to fill the electroconductive material 16 into the throughholes 13, the electroconductive material 16 can be densely formed within the throughholes without forming any void part.

The excess electroconductive material 16 on the face 12a of the core substrate 12 and the excess electroconductive material 16 on the face 12b, and the electroconductive base layer 15 are then removed by polishing to manufacture an electroconductive material-filled throughhole substrate 11 (FIG. 1 (E)).

The above embodiment is illustratively only and is not intended to limit the present invention. For example, throughholes 13 may be bored directly on a core substrate 12 having a desired thickness by ICP-RIE (inductive coupled plasma-reactive ion etching) which is a dry etching method utilizing plasma.

EXAMPLES

The following Examples further illustrate the present invention.

Example 1

A silicon substrate having a thickness of 625 μm and a diameter of 150 mm was provided as a core substrate. A novolak positive-working resist material (PMER-P-LA900PM, manufactured by Tokyo Ohka Kogyo Co., Ltd.) was coated onto one side of the core substrate, and the assembly was exposed and developed through a photomask for throughhole formation. Thus, mask patterns having four types of circular openings respectively with diameters of 10 μm, 30 μm, 70 μm, and 100 μm were formed. More specifically, a mask pattern having circular openings with a diameter of 10 μm provided at pitches of 20 μm, a mask pattern having circular openings with a diameter of 30 μm provided at pitches of 60 μm, a mask pattern having circular openings with a diameter of 70 μm provided at pitches of 150 μm, and a mask pattern having circular openings with a diameter of 100 μm provided at pitches of 200 μm were formed.

Next, the core substrate was dry etched by ICP-RIE (inductive coupled plasma-reactive ion etching) using the mask pattern as a mask to form a plurality of pores. The depth of the pores was about 250 μm.

The unnecessary mask pattern was then removed, and the backside of the core substrate was polished to expose pores and thus to form throughholes. Thus, a core substrate having throughholes (thickness 200 μm) was manufactured.

Next, an electroconductive base layer having a laminated structure comprising a 30 nm-thick layer of titanium and a 200 nm-thick layer of copper was formed by sputtering on one side of the core substrate.

Electroplating (average current density 1 A/dm$^2$) was then carried out for 5 hr with a filled plating solution having the following composition using the electroconductive base layer as a seed layer to conduct copper plating from the backside of the core substrate and thus to fill copper into the throughholes.

(Composition of Filled Plating Solution)

| | |
|---|---|
| Sulfuric acid | 50 g/L |
| Copper sulfate | 200 g/L |
| Chloride ion | 50 mg/L |
| Additive (ESA21-A, manufactured by C. Uyemura & Company Ltd.) | 2.5 mL/L |
| Additive (ESA21-B, manufactured by C. Uyemura & Company Ltd.) | 10 mL/L |

The excessive copper film on the core substrate and the electroconductive base layer were then removed by polishing to prepare an electroconductive material-filled throughhole substrate.

The electroconductive material-filled throughhole substrates thus prepared were observed under an optical microscope for the filled state of the electroconductive material (copper) within the throughholes. As a result, it was confirmed that the electroconductive material was densely filled without forming any void part.

Example 2

An electroconductive material-filled throughhole substrate was prepared in the same manner as in Example 1, except that an electroconductive base layer having a laminated structure comprising a 30 nm-thick titanium layer and a 200 nm-thick copper layer was formed by using vapor deposition instead of sputtering, and a filled plating solution having the following composition was used instead of the filled plating solution used in Example 1.

(Composition of Filled Plating Solution)

| | |
|---|---|
| CU-BRITE VFII A (manufactured by EBARA-UDYLITE CO., LTD.) | 50 mL/L |
| CU-BRITE VFII B (manufactured by EBARA-UDYLITE CO., LTD.) | 4 mL/L |
| Sulfuric acid | 50 g/L |
| Copper sulfate | 200 g/L |
| Hydrochloric acid | 40 g/L |

The electroconductive material-filled throughhole substrates thus prepared were observed under an optical microscope for the filled state of the electroconductive material (copper) within the throughholes. As a result, it was confirmed that the electroconductive material was densely filled without forming any void part.

Comparative Example

A core substrate having throughholes (thickness 200 μm) was first prepared in the same manner as in Example. 1.

An electroconductive base layer (thickness 200 nm) of copper was then formed by MO-CVD (metal organic-chemical vapor deposition) on both sides of the core substrate and within the throughholes.

Both sides of the core substrate were then plated with copper by electroplating using the electroconductive base layer as a seed layer and using the same filled plating solution and plating conditions as in Example 1 to fill copper into the throughholes.

The excess copper film and the electroconductive base layer on the core substrate were then removed by polishing to prepare an electroconductive material-filled throughhole substrate.

The electroconductive material-filled throughhole substrates thus prepared were observed under an optical microscope for the filled state of the electroconductive material (copper) within the throughholes. As a result, it was found that void parts were scattered over a maximum length of about 100 μm within 200 μm-long throughholes.

INDUSTRIAL APPLICABILITY

The electroconductive material-filled throughhole substrate according to the present invention is useful for the manufacture of various wiring boards, multilayer wiring boards, electronic equipment and the like.

The invention claimed is:

1. A method for manufacturing an electroconductive material-filled throughhole substrate of which the front side and back side have been electrically conducted to each other through an electroconductive material filled into the throughholes comprising the steps of:
   forming an electroconductive base layer on one side of a core substrate having throughholes, wherein the electroconductive base layer has an opening corresponding to the throughholes; and
   filling the throughholes with an electroconductive material by electroplating using the electroconductive base layer as a seed layer;

wherein the electroconductive material is precipitated on the electroconductive base layer and further, the electroconductive material is precipitated in the openings to clog the openings at a clog site, and then the electroconductive material is precipitated and grown from the clog site toward the inside of the throughholes to fill the electroconductive material into the throughholes.

2. The method according to claim 1, characterized in that the core substrate having the throughholes is formed by subjecting the core substrate to dry etching utilizing plasma to form throughholes having an opening diameter in the range of 10 to 100 μm.

3. The method according to claim 1, characterized in that the core substrate having the throughholes is formed by subjecting the core substrate to dry etching utilizing plasma from one side of the core substrate to form pores having an opening diameter in the range of 10 to 100 μm to a predetermined depth and then polishing the other side of the core substrate to expose the pores on the other side of the core substrate and thus to form throughholes.

4. The method according to claim 1, characterized in that the electroconductive base layer is formed by either vapor deposition or sputtering.

5. The method according to claim 1, characterized in that the throughholes are formed so as to have an opening diameter in the range of 10 to 70 μm.

6. The method according to claim 1, characterized in that the core substrate is a silicon substrate.

7. The method according to claim 1, characterized in that the electroconductive material is copper.

* * * * *